United States Patent [19]
Neumann

[11] Patent Number: 5,481,437
[45] Date of Patent: Jan. 2, 1996

[54] APPARATUS ASSEMBLY OF AN ELECTROTECHNICAL APPARATUS

[75] Inventor: Werner Neumann, Owingen, Germany

[73] Assignee: Bodenseewerk Gerätetechnik GmbH, Überlingen, Germany

[21] Appl. No.: 211,413

[22] PCT Filed: Sep. 30, 1992

[86] PCT No.: PCT/EP92/02266

§ 371 Date: Apr. 4, 1994

§ 102(e) Date: Apr. 4, 1994

[87] PCT Pub. No.: WO93/07737

PCT Pub. Date: Apr. 15, 1993

[30] Foreign Application Priority Data

Oct. 4, 1991 [DE] Germany .......................... 41 32 994.5

[51] Int. Cl.⁶ ..................................................... H05K 7/14
[52] U.S. Cl. ........................... 361/796; 361/752; 361/757
[58] Field of Search ..................................... 361/730, 736, 361/739, 752, 756, 757, 784, 788, 796–797, 798–802; 437/208, 915

[56] References Cited

U.S. PATENT DOCUMENTS 4,758,459   7/1988   Mehta .

FOREIGN PATENT DOCUMENTS

| 403975 | 12/1990 | European Pat. Off. . |
| 3211758 | 10/1983 | Germany . |
| 3417451 | 11/1985 | Germany . |
| 3500411 | 7/1986 | Germany . |
| 3928461 | 3/1991 | Germany . |
| 607453 | 12/1978 | Switzerland . |

OTHER PUBLICATIONS

Jerzy, Der Einsatz von Klebstoffen in Mikroelektronik, Mikroelektronik und Telekommunikation, Technischer Rundschau, vol. 20 (1986) at 50–56.

*Primary Examiner*—Bot L. Ledynh
*Attorney, Agent, or Firm*—James Creighton Wray

[57] ABSTRACT

The invention provides a low cost apparatus assembly of an electrotechnical apparatus. The housing walls consist of plate-shaped elements. The dimensions and weight of the plate-shaped elements are considerably reduced as compared to the existing elements. The assembly has a housing wall with plate-shaped elements. At least part of the plate-shaped elements are synthetic plastic plates, which are metal-coated over a continuous surface area on one side. The metal-coated surfaces are interconnected electrically conductively. One or several of the metal-coated synthetic plastic plates are designed as printed circuit boards. They are provided with electrical and/or mechanical elements on the side which is not metal-coated. As the case may be, they are provided with strip conductors. The plate-shaped elements of metal, if present, are electrically conductively connected to the metal-coated surface of the synthetic plastic plates. Other important properties, particularly those relating to the protection of the apparatus against mechanical influences such as shock, vibration, influences of temperature, humidity and the like and also the protection against electrical and electromagnetic fields (EMV-protection, high-voltage protection and the like), remain unaffected.

21 Claims, 5 Drawing Sheets

5,481,437

1

APPARATUS ASSEMBLY OF AN ELECTROTECHNICAL APPARATUS

BACKGROUND OF THE INVENTION

The invention relates to an apparatus assembly of an electrotechnical apparatus (a) the housing wall of which consists of plate-shaped elements, (b) at least part of the plate-shaped elements being synthetic plastic plates, (c) which are metal-coated on one side, (d) the metal-coated surfaces being interconnected electrically conductively.

Housings for electrotechnical apparatus are known in numerous forms. In the following, electrotechnical apparatus designate apparatus which are composed of mechanical, electromechanical and/or electronical elements. Among other things, the housings serve for protection of the elements arranged in the housing against external influences. The extrenal influences can be mechanical effects and also atmospheric influences or similar external influences. If the housing is made of metal, it can also protect the elements arranged in the housing against influences of electrical or electromagentic fields (EMV-protection, high-voltage protection and the like). Elements can be arranged on the inner walls of the housing or on plates or walls arranged within the housing, which elements serve for accommodation and guiding of printed circuit boards or boards, on which mechanical, electrical, electromechanical or electronical elements are arranged. In the housings printed circuit boards or boards can be arranged, which are provided with card plugs and are located one below the other for connection of the individual printed circuit boards or cards. The individual elements can be arranged on the printed circuit boards or cards by means of the SMD-technique. Apertures can be provided in the outer walls of the housing, which apertures serve for accommodation of appartus plugs and/or test plugs. The housing walls can consist of interconnected plate-shaped elements. Thereby, the size and shape of the housing can easily be adapted to the respective requirements and the manufacturing costs are considerably reduced with small and medium piece numbers. By the use of flexible connections in the SMD-technique it is no longer necessary to use cable trees for connection of individual assemblies, which cable trees are costly in manufacturing, the layout of which requires apertures and supports and with which connection errors cannot always be avoided. Without large efforts and expensive preparations, it is possible to test individual assemblies or a plurality of assemblies, without total assembly of the apparatus being required. This results in reduction of the working time required for assembling the apparatus and of the numbers of elements, and in a reduction of the time for checking. Nevertheless, the individual elements and assemblies remain easily available.

From DE-OS 34 17 451 a cuboid push-in housing for electronical apparatus is known, into which housing insert card type modular push-in units and the like can be inserted, the cover plate, the bottom plate, the side plates and bars of which housing consist of an integral moulded synthetic plastic part, the housing being provided with an electrically conductive or ferromagnetic layer on the inside and/or outside. This coating is preferably provided on all sides. However, with this housing it is not provided to design the housing wall itself as printed circuit boards. From U.S. Pat. No. 4,758,459 a housing is known, the outer surfaces of which can be metal-coated, if required. Within the housing printed circuit boards are arranged, which can be mechanically connected to the housing walls. The interconnection of the printed circuit boards and the lead-out conductors thereof are effected by a wiring arranged centrally in the housing.

The component assembly of printed circuit boards by means of the SMD-technique using adhesive connections is known from Miszak Jerzy "Der Einsatz von Klebstoffen in Mikroelektronik, Mikrotechnik und Telekommunikation", Technische Rundschau, 20/86, p. 50–53, and the connection of a flex band to a printed circuit board is known from DE-OS 35 00 411.

Furthermore, from DE-OS 39 28 461 an assembly support having two metallic side walls is known, between which, at the four edges thereof, profile bars of metal extend, which are attached to the side walls and carry guiding supports, which are designated for accommodation of assemblies.

From DE-PS 32 11 758 a housing for the electrical communication technology is known, which has a sheet metal frame of the housing and the individual mutually screened plug-in units of which consist of boat-shaped sheet metal elements.

SUMMARY OF THE INVENTION

It is the object of the invention to provide an apparatus assembly of an electrotechnical apparatus, the housing walls of which consist of plate-shaped elements and the dimensions and weight of which are considerably reduced as compared to the known constructions. This reduction is highly desirable and of great advantage in almost all applications, particularly in the aircraft and space technology.

With the apparatus assembly, according to the invention, these advantages are to be achieved without affecting other important properties, particularly as far as the protection of the apparatus against mechanical influences such as shock, vibration, influences of temperature, humidity and the like and also the protection against electrical and electromagnetic fields (EMV-protection, high-voltage protection and the like) is concerned. Finally, it shall be possible to assemble the apparatus assembly without substantial expenditure of work and at low costs.

According to the invention this object is achieved by an apparatus assembly according to the preamble, in which (e) one or several of the metal-coated synthetic plastic plates are designed as printed circuit boards in such a manner that they are provided with electrical and/or mechanical elements on the side which is not metal-coated and, as the case may be, provided with strip conductors, (f) and plate-shaped elements of metal, if present, are electrically conductively connected to the metal-coated surface of the synthetic plastic plates.

Modifications of the invention are subject matter of the sub-claims.

An embodiment of the invention will now be described in greater detail with reference to the accompanying drawings.

DETAILED DESCRIPTION OF THE DRAWINGS

Figure 1:
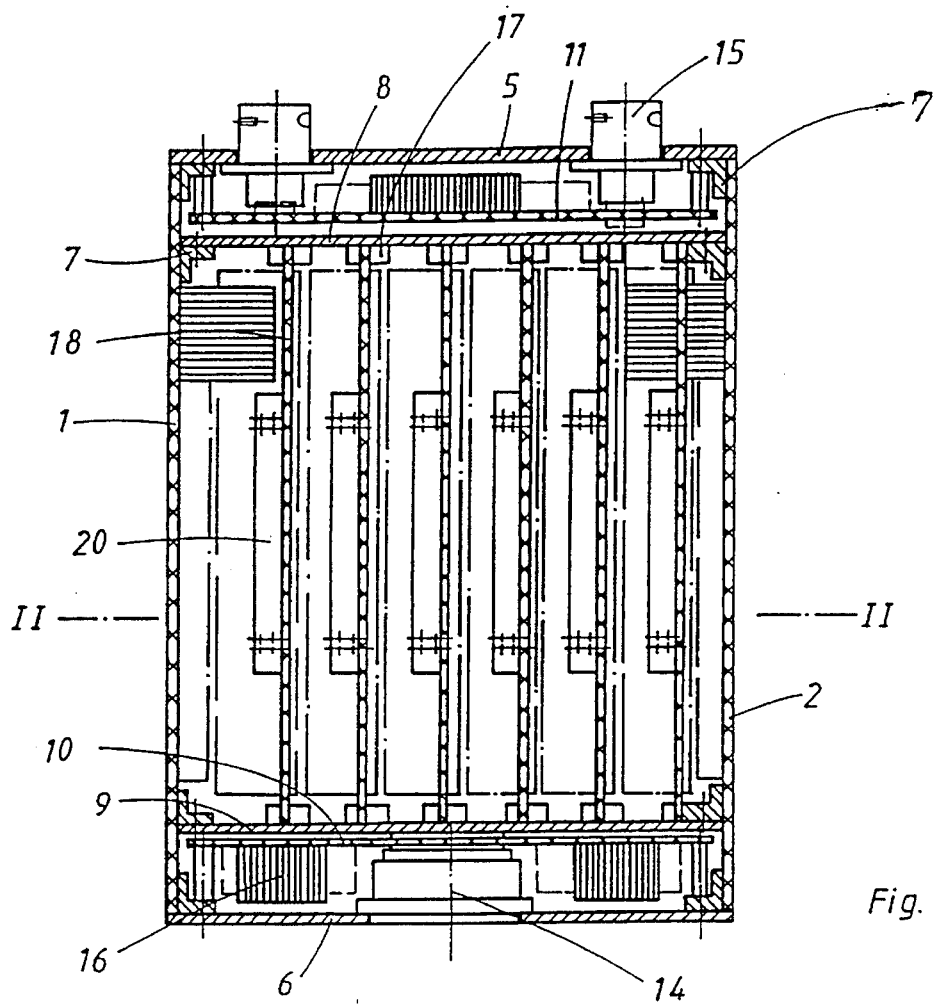
FIG. 1 shows a plan view of the apparatus assembly with the top cover removed.
Figure 2:
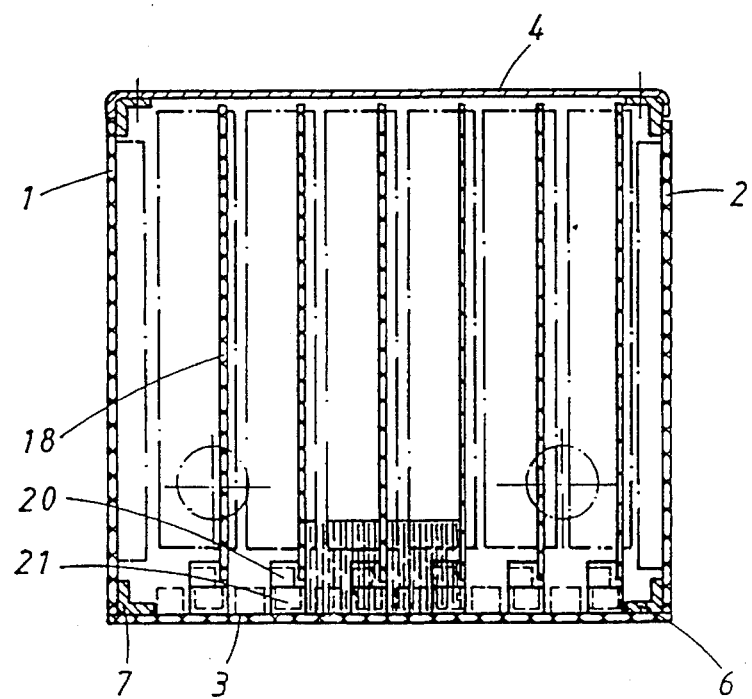
FIG. 2 shows a section through the apparatus assembly taken along the line II—II in FIG. 1.

In FIGS. 1 and 2 the side walls are designated by numerals 1 and 2, and in FIG. 2 the bottom is designated by numeral 3. Side walls and bottom consist of synthetic plastic material reinforced by glass fibers or carbon fibers and are metal-coated over the total surface or laminated with a metal layer, particularly of copper, on their outsides. The metal coating also extends on the intersection edges of these plate-shaped elements 1, 2, and 3. Thereby, the metal coatings on the outside of the plate-shaped elements 1, 2, and 3 are conductively interconnected, although also further conductive connections not illustrated in the drawing can be present. The top cover designated by numeral 4 in FIG. 2 consist of aluminum, and also the front wall 5 and back wall 6 visible in FIG. 1. The walls 5 and 6 are conductively connected to the metal-coated surfaces of the side walls 1 and 2 and of the bottom 3. Angle brackets 7 serve for mechanical connection, which angle brackets can consist of extruded aluminum.

Figure 3:
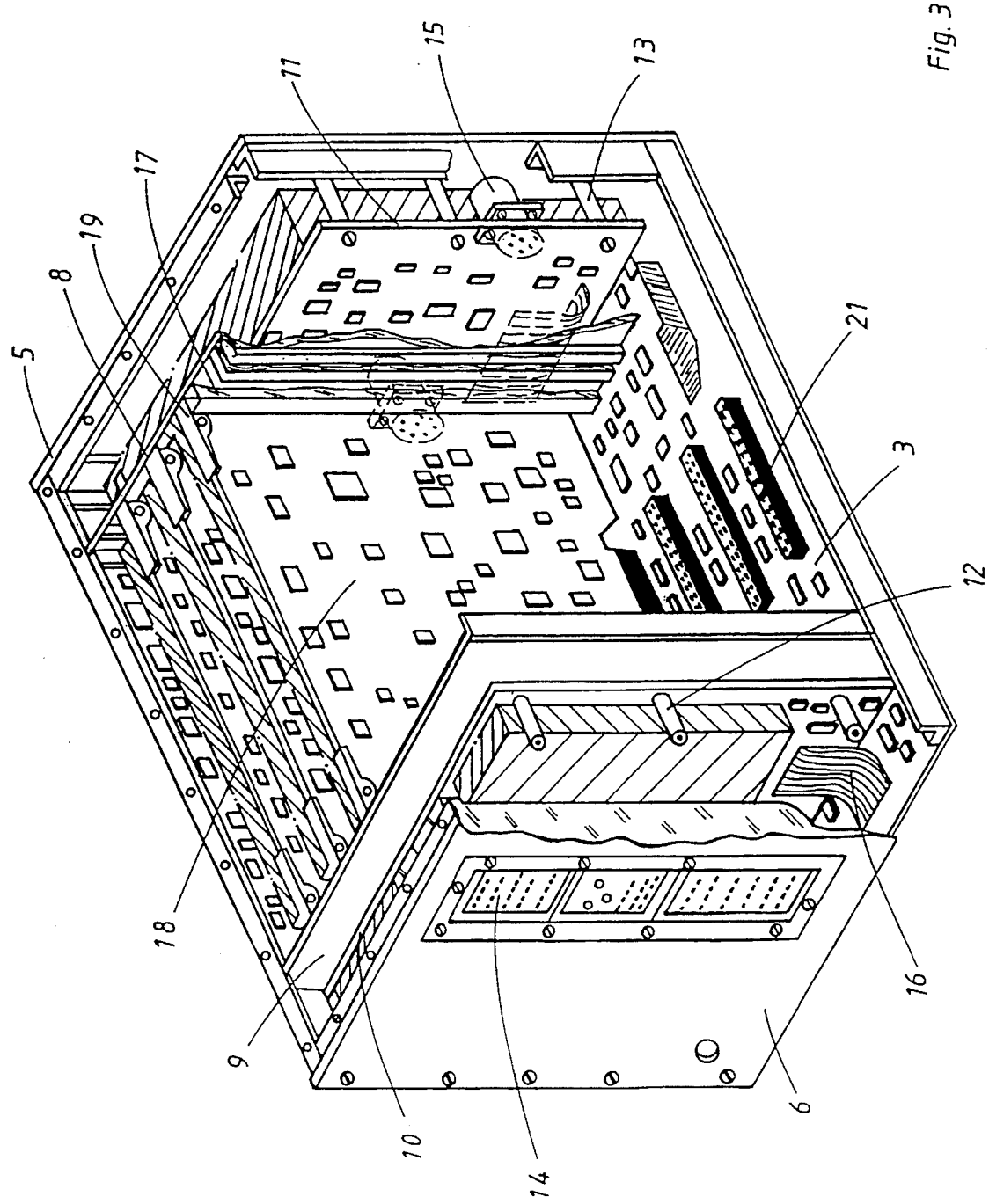
FIG. 3 is a perspective opened view of the apparatus assembly according to the FIGS. 1 and 2.

As can be seen from FIGS. 1 and 3, partitions 8 and 9 extend between the side walls 1 and 2 parallel to the front wall 5 and to the back wall 6, respectively, and spaced therefrom. These partitions 8 and 9 consist of aluminum. They extend vertically from the bottom 3 to the top cover 4. A printed circuit board 10 is located in the space between the back wall 6 and the partition 9, and in the same way a printed circuit board 11 is located between the front wall 5 and the partition 8. The printed circuit boards 10 and 11 are mechanically connected to the front wall 5 and the back wall 6, respectively, through spacers 12 and 13, respectively. Particularly when apertures for apparatus plugs 14 and test plugs, respectively, are provided in the front wall and/or the back wall 6, the spaces, in which the printed circuit boards 10 and 11 are located, are not as completely protected against the influence of magnetical or electromagnetic fields as the space between the partitions 8 and 9. Elements can be arranged on the printed circuit boards 10 and 11, which elements, in this respect, do not require the best protection as possible as, for example, filter assemblies, high-voltage protectors and the like. The printed circuit boards 10 and 11 can also be provided with the apparatus plugs 14 and the test plugs, respectively. Apart from that, the component assembly of the printed circuit boards 10 and 11 can also be effected on both sides. The electrical connection of the printed circuit boards 10 and 11 to the bottom plate 3 is effected by flexible connecting strips 16. These are strips and tapes, respectively, of a flexible non-conductive foil material, on which a plurality of strip conductors are provided.

These flexible connecting strips 16 and the connection of their strip conductors to the strip conductors of those printed circuit boards, on which they are arranged, are described below in further detail.

Guiding devices 17 for printed circuit boards 18 are provided on the inner sides of the partitions 8 and 9. The guiding devices 17 and the associated locking devices 19 are only schematically illustrated in the drawings. The printed circuit boards 18 are equipped with components on both sides, at least partly. There is a large freedom in the choice of the component assembly technique, the connection can be effected by means of the wire ends of the components or the components can be mounted on the printed circuit boards by means of the SMD-technique; the printed circuit boards can be provided with bores and/or be through-connected or, in particular when the SMD-technique is used, can be provided without bores or through-connections.

Figure 7:
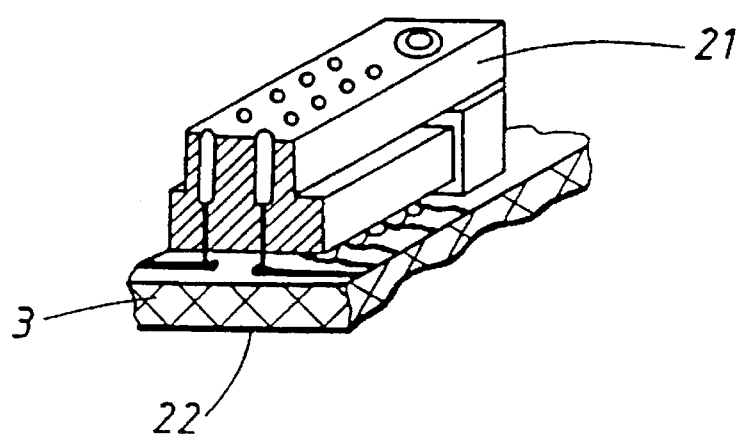
FIG. 7 shows the arrangement of a card plug on a bottom plate.

The connection of the printed circuit boards 18 to the bottom plate 3 is effected through card plugs 20, 21. The parts 20 thereof are attached to the printed circuit boards 18, while the parts 21 thereof are arranged on the bottom 3. As can be seen from FIG. 7, the arrangement of the plug parts 21 on the bottom 3 is effected in such a manner that an electrical connection of the electrically conductive elements provided in the plug portion 21 indeed exists with the strip conductors arranged on the upper side of the bottom plate 3, but not with the metal coating 22 located on the underside of the bottom plate 3.

Figure 5:
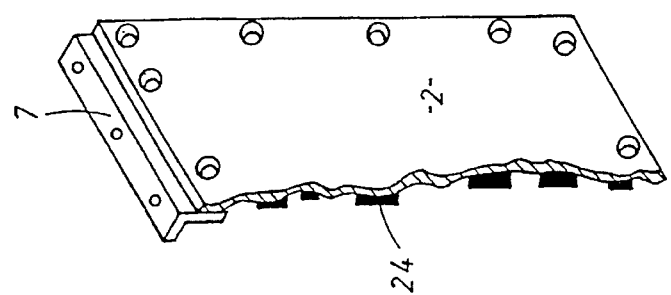
FIG. 5 shows a part of a side wall with angle brackets arranged thereon.
Figure 4:
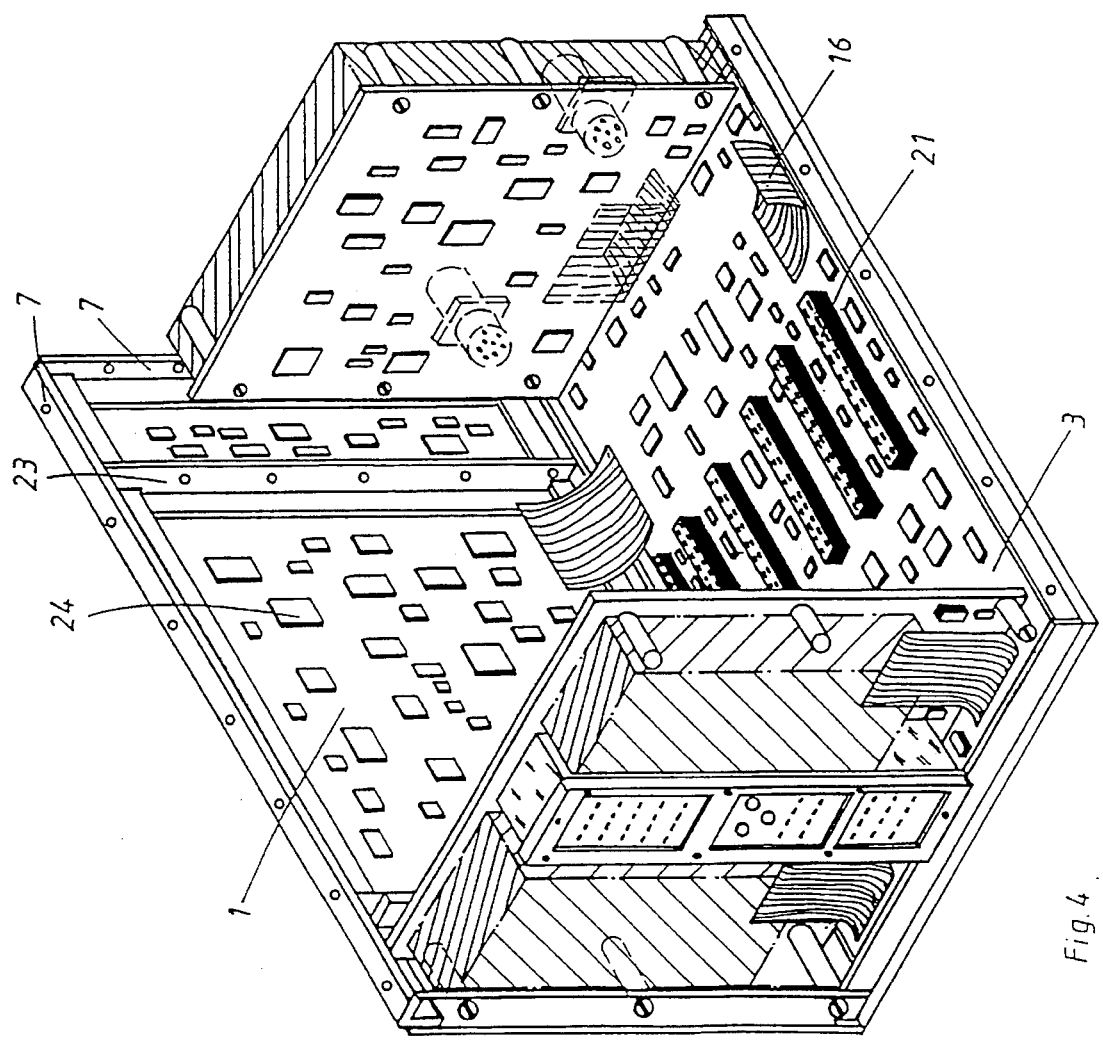
FIG. 4 shows the apparatus assembly according to FIG. 3 after further printed circuit boards and the front and back wall have been removed.

FIG. 4 shows, in the same illustration as FIG. 3, a similar apparatus assembly, in which, however, the printed circuit boards 18 and the partitions 8 and 9 are omitted. The angle bracket serving to attach the partitions 8 is designated by numeral 23. The outside of the side wall 1 not visible in FIGS. 3 and 4 is metal-coated over all of the surface. As can be seen in particular from FIG. 4, the side of the side wall 1 facing the interior of the apparatus is designed as printed circuit board and, to this end, provided with strip conductors and equipped with elements 24 in SMD-technique. As can be seen from FIG. 5, the side wall 2 is designed correspondingly. With this design of the side walls 1 and 2, their sides of the printed circuit board directed to the interior of the apparatus and their continuous metal-coated outside surfaces are electrically independent of each other. The electrical connection of the sides of the printed circuit boards of the side walls 1 and 2 to the bottom plate 5 is effected through flexible connecting strips 16.

By the above described design of the side walls 1 and 2 as printed circuit boards on one side, a considerable reduction of the volume and the weight of the apparatus assembly is effected. The reduction of weight corresponds to the weight of two printed circuit boards (equipped on one side) or one printed circuit board (equipped on both sides) and the required space is reduced correspondingly. A further reduction of weight is achieved in that aluminum is not used for the side walls 1 and 2 but a specifically substantially lighter synthetic plastic material reinforced by glass fibers or carbon fibers, the mechanical properties of which are at least equal to those of aluminum. The same also holds true for the bottom 3 consisting of metal-coated synthetic plastic material.

Care is taken that the metal-coated or metal laminated outer surfaces of the side walls 1 and 2 and the bottom 3 are in reliable electrically conductive connection with the structure elements of the apparatus assembly consisting of metal, as, for example, the top cover 4, the front wall 5, the back wall 6, the partitions 8 and 9 and the angle brackets 7 and

23.

Figure 6:
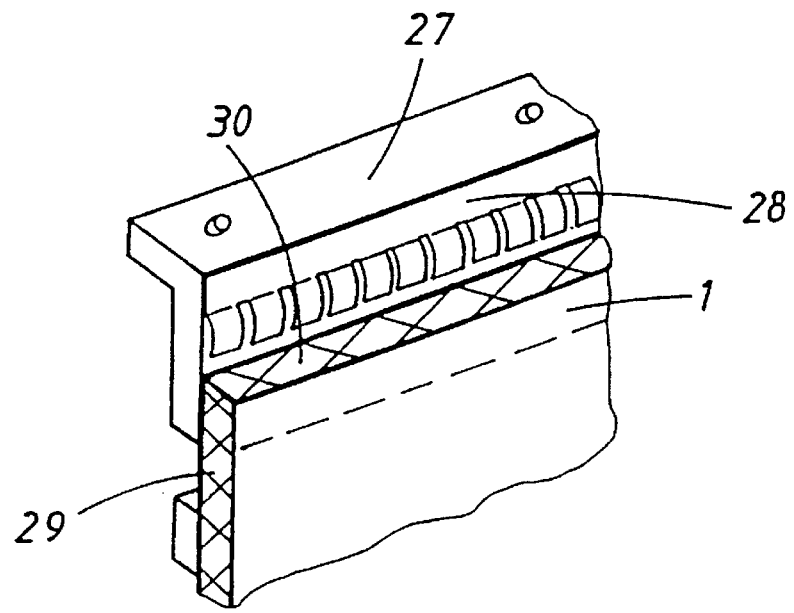
FIG. 6 shows the electrically conductive connection of a side wall to an angle bracket.

An example of a direct electrically conductive connection is illustrated by means of FIG. 6. Therein, a section of one of the angle brackets 7 visible in FIG. 4 is designated by numeral 27. A grounding spring strap 28 is arranged, electrically conductively connected, on the leg which the side wall 1 (or 2)is to engage. The side wall 1 is metal-coated over all of its surface on its top surface as viewed in the plane of the drawing. The metal coating also extends over the intersection edges 29 and 30 and, not visible in the drawing, over the edge area of the side of the side wall 1 which is not metal-coated over all of its surface. All of these metal coatings are conductively interconnected. In order to establich the conductive connection between the angle brackets 27 and the side part 1, the side part 1 is pressed with its metal-coated edge area, not visible in the drawing, against the grounded spring strap 28.

Figure 8:
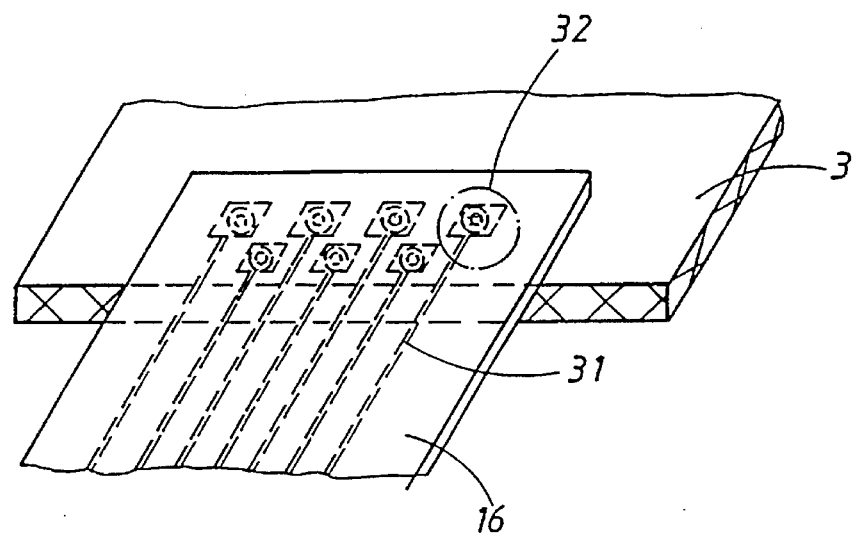
FIG. 8 shows, in simplified perspective plan view, the connection of a rigid printed circuit board to strip conductors arranged on a flexible support.
Figure 9:
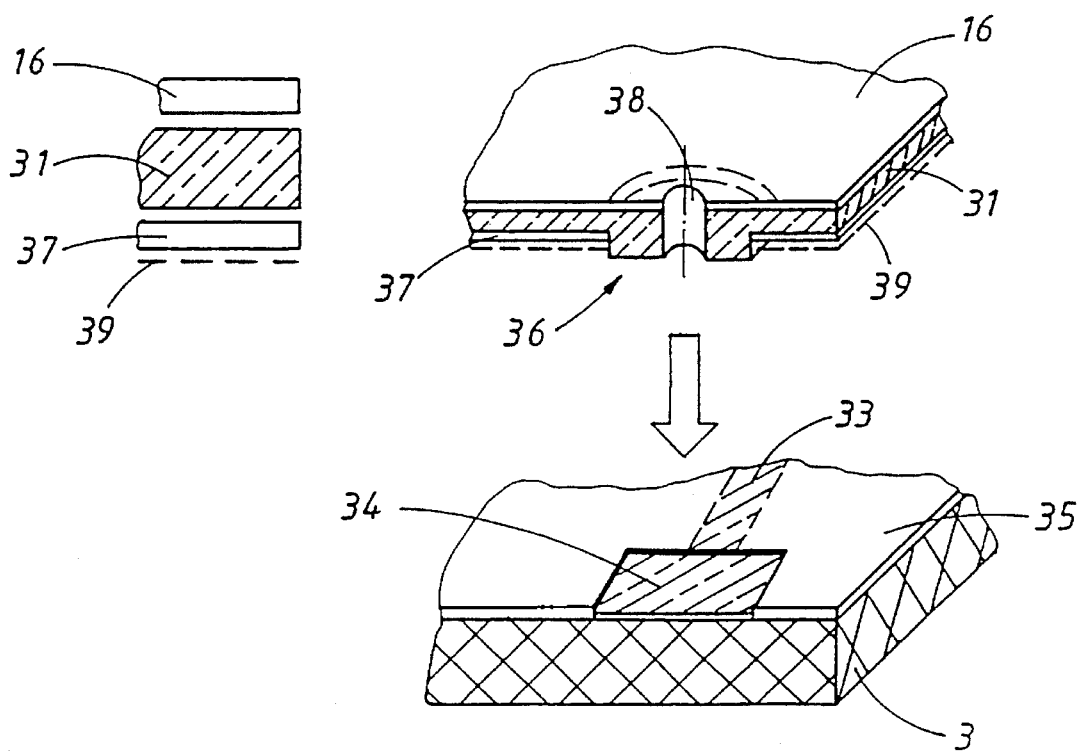
FIG. 9 shows, as detail from FIG. 8, partial sections of a rigid printed circuit board and a flexible part before the connection has been established.

A flexible connecting strip 16 with the strip conductors 31 located thereon and their electrically conductive connection, not shown in the drawing, with strip conductors on the bottom plate 3 are shown in the FIGS. 8 and 9. Instead of the bottom plate 3 the connection can also be with one of the side walls 1, 2 or of another printed circuit board as, for example, 10 or 11. A connection generally designated by numeral 32 is illustrated in detail by means of FIG. 9. The rigid bottom plate 3 consists of non-conductive synthetic plastic material reinforced by glass fibers or carbon fibers. It can also consist of a non-conductive ceramic material. The flexible connecting strip 16, which also is called "flex", can be a foil consisting of a thermostable polyimide, for example Kapton of Du Pont. In the graphical illustration of FIG. 8, the strip conductors 31 are located on the underside of the flexible strip 16. The strip conductors located on the rigid printed circuit board 3 are not illustrated in FIG. 8. The individual connections generally designated by numeral 32 are further described in the following by means of FIG. 9.

In the lower part of FIG. 9 a strip conductor 33 is located on the rigid printed circuit board 3 illustrated sectionally, which strip conductor 33 communicates with a solder plate 34 electrically connected thereto. The strip conductor 33 and the solder plate 34 are manufactured in known manner, for example by etching, and can have different thicknesses if desired. At least the solder surface 34 is tinned or coated by a solder paste known from the SMD-technique.

A cover foil 35 preventing the solder flux is located on the upper surface of the rigid printed circuit board 3. The cover foil 35 is shaped such that the soldering surface 6 is freely accessible from the top while it can cover the strip conductor 33. Instead of the cover foil also a correspondingly formed coating of a solder stop lacquer can be used. The surface of the soldering surface 34 is located slightly deeper as the surface of the cover foil 35 preventing the solder flux.

A strip conductor 31 consisting of copper is located in the upper part of FIG. 9 below the foil 16 serving as flexible printed circuit board, which strip conductor 31 can be narrower than illustrated in the drawing. A soldering surface 36 is located below the strip conductor 31 and is connected thereto. The soldering surface 36 has a hollow cylindrical shape and has larger height and thickness than the strip conductor 31. Its lower annular surface facing the soldering surface 34 is tinned or coated by a solder paste containing tin. The outer diameter of the annular surface is smaller than the side length of the square soldering surface 34 or the section formed in the cover foil 35, respectively. A cover foil 37 preventing the solder flux is located on the underside of the strip conductor 31, which cover foil 37, however, does not cover the annular soldering surface 36 facing the soldering surface 34. Instead of the cover foil preventing the solder flux also a layer of solder stop lacquer can be used.

In the area of the soldering surface 36 and through it, a check bore 38 extends through the flexible foil 16 and the strip conductor 31. The underside of the cover foil 37 preventing the solder flux is coated by a heat curable plastic adhesive, In order to join the connections, the printed circuit boards 3 and 16 are fittedly pressed one upon the other and heated on both sides, at least, however, on the outside of the printed circuit board 16. The heating can, for example, be effected by means of a correspondingly large plane surface of an instrument similar to a soldering bit. Thereby, the tin located on the soldering surfaces 34 and 36 is melted and connects the soldering surfaces with each other. At the same time the adhesive layer 39 is hardened and establishes a reliable mechanical connection between the printed circuit boards 3 and 16. The quality of the solder connections can be checked optically through the check bores 38.

By the connection described above, a metal coating or metallic lamination located on the side of the printed circuit board 3 opposite the connections is completely unspoiled and unaffected.

I claim:

1. An electrotechnical apparatus assembly comprising a housing having plural walls, housing plates having first and second opposite surfaces forming said walls, at least portions of said housing plates being of synthetic plastic material, each housing plate having a continuous metal coated area on the first surface, said metal coated areas of interconnected walls being electrically conductive, at least one of said housing plates being printed circuit boards, wherein components of the printed circuit board are on the second surface, plural metal plates being in electrical conductive connection with the metal coated surface areas of said housing plates.

2. The apparatus assembly of claim 1, further comprising plural strip conductors on at least one of the housing plates on the second surface.

3. The apparatus assembly of claim 1, further comprising plural electrical components on at least one of the housing plates on the second surface.

4. The apparatus assembly of claim 1, further comprising plural mechanical components on at least one of the housing plates on the second surface.

5. The apparatus assembly of claim 1, wherein the housing plates are metal-coated over an entire surface of each plate.

6. The apparatus assembly of claim 1, wherein the housing walls have the plates with the metal-coated areas on outer sides of the housing.

7. The apparatus assembly of claim 1, further comprising metal-coated edges on the housing plates, wherein the metal-coated edges are in electrical conductive connection with the metal-coated areas.

8. The apparatus assembly of claim 1, further comprising card plugs connecting the printed circuit boards.

9. The apparatus assembly of claim 1, wherein the components are connected by SMD-technique.

10. The apparatus assembly of claim 2, further comprising plural flexible foils, plural strip conductors arranged on the flexible foils, said foils being connected to the printed circuit boards.

11. The apparatus assembly of claim 1, further comprising the printed circuit boards forming rigid supports, plural first strip conductors arranged on the board, plural second strip conductors, plural flexible foils arranged on the boards, said second strip conductors being arranged on the flexible foils, said first and second strip conductors each having complementary soldering surfaces, one of said complementary soldering surfaces being coated with solder, with the opposing soldering surfaces being soldered together for interconnecting said strip conductors.

12. The apparatus assembly of claim 11, further comprising protection means partially surrounding at least one of said soldering surfaces provided on the support for preventing a solder flux.

13. The apparatus assembly of claim 12, further comprising at least one recess on the support having a surface below a surface of the protection means, wherein the at least one of said soldering surfaces provided on the support is arranged in the recess for preventing a solder flux.

14. The apparatus assembly of claim 12, further comprising at least one elevation on the support having a surface above a surface of the protection means, wherein the at least one of said soldering surfaces is arranged for preventing a solder flux.

15. The apparatus assembly of claim 11, wherein the soldering surfaces are rectangular on at least one of said supports.

16. The apparatus assembly of claim 11, wherein the soldering surfaces are circular on at least one of said supports.

17. The apparatus assembly of claim 11, wherein dimensions of the soldering surfaces of at least one of said supports have smaller dimensions than the soldering surfaces of another of said supports.

18. The apparatus assembly of claim 11, further comprising openings in the soldering surfaces on one of said supports.

19. The apparatus assembly of claim 11, wherein adjacent supports are connected by adhesion.

20. The apparatus assembly of claim 1, wherein a plurality of printed circuit boards are arranged on an outside of the housing and outside of the metal plates.

21. The apparatus assembly of claim 5, further comprising metal edges on the housing plates having metal coated surfaces on the entire surface, said edges being in electrical conductive connection with the metal coated surface.

\* \* \* \* \*